(12) United States Patent
Park

(10) Patent No.: US 11,276,349 B2
(45) Date of Patent: Mar. 15, 2022

(54) ORGANIC LIGHT EMITTING DISPLAY DEVICE AND METHOD FOR DRIVING THE SAME

(71) Applicant: Samsung Display Co., Ltd., Yongin-si (KR)

(72) Inventor: Jong Woong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/413,604

(22) Filed: May 16, 2019

(65) Prior Publication Data

US 2020/0027401 A1 Jan. 23, 2020

(30) Foreign Application Priority Data

Jul. 18, 2018 (KR) .................. 10-2018-0083617

(51) Int. Cl.
*G09G 3/3258* (2016.01)
*H01L 27/32* (2006.01)

(52) U.S. Cl.
CPC ....... *G09G 3/3258* (2013.01); *H01L 27/3276* (2013.01); *G09G 2310/0264* (2013.01); *G09G 2310/08* (2013.01)

(58) Field of Classification Search
CPC ......... G09G 3/3258; G09G 2310/0264; G09G 2310/08; H01L 27/3276
USPC .......................................................... 345/76
See application file for complete search history.

(56) References Cited

U.S. PATENT DOCUMENTS

| 7,675,492 B2 | 3/2010 | Park et al. | |
|---|---|---|---|
| 2016/0012774 A1* | 1/2016 | Ohara | G09G 3/2025 345/694 |
| 2016/0125809 A1* | 5/2016 | Hwang | G02F 1/13 345/212 |
| 2016/0133191 A1* | 5/2016 | Kang | G09G 3/3258 345/212 |

(Continued)

FOREIGN PATENT DOCUMENTS

| KR | 10-2015-0025538 | 3/2015 |
|---|---|---|
| KR | 10-2017-0114023 | 10/2017 |

OTHER PUBLICATIONS

Machine translation of Korean Patent Application No. KR201500255 (Year: 2015).*

*Primary Examiner* — Stephen G Sherman
(74) *Attorney, Agent, or Firm* — H.C. Park & Associates, PLC

(57) ABSTRACT

An organic light emitting display device includes: a display unit including a plurality of pixels each coupled to a first scan line, a second scan line, and a data line; a scan driver configured to supply, to the display unit, a plurality of first scan pulses corresponding to a bias period and a second scan pulse corresponding to a data write period after the bias period through the respective first and second scan lines; an emission driver configured to supply an emission control signal to the display unit through emission control lines; a data driver configured to supply a data voltage to the display unit through the data lines; and a power supply configured to commonly supply, to the pixels, an initialization voltage, the initialization voltage having a voltage level switching between a first voltage level and a second voltage level in a preset period.

17 Claims, 9 Drawing Sheets

(56) References Cited

U.S. PATENT DOCUMENTS

2017/0061875 A1\* 3/2017 Cho .................... G09G 3/3233
2017/0287404 A1  10/2017 Kim et al.

\* cited by examiner

ORGANIC LIGHT EMITTING DISPLAY DEVICE AND METHOD FOR DRIVING THE SAME

CROSS-REFERENCE TO RELATED APPLICATION

This application claims priority from and the benefit of Korean patent application 10-2018-0083617 filed on Jul. 18, 2018, which is hereby incorporated by reference for all purposes as if fully set forth herein.

BACKGROUND

Field

Exemplary embodiments/implementations of the invention relate generally to a display device, and more specifically, to an organic light emitting display device and a method for driving the same.

Discussion of the Background

Among display devices, an organic light emitting display device displays an image using an organic light emitting diode that generates light by recombination of electrons and holes. The organic light emitting display device has a high response speed and is driven with low power consumption.

Meanwhile, a driving transistor included in a pixel has a hysteresis characteristic in which a threshold voltage is shifted and a current is changed depending on a change in gate voltage. A current different from that set in the pixel flows according to a previous data voltage of the pixel due to the hysteresis characteristic of the driving transistor. Accordingly, the pixel does not generate light with a desired luminance in a current frame.

In particular, when a white grayscale is expressed after a black grayscale is displayed, each pixel generates light with a luminance lower than a desired luminance during a predetermined frame period due to the hysteresis characteristic. For example, an instantaneous afterimage may be viewed.

Therefore, there is required a method for displaying an image with a desired luminance regardless of the magnitude of a data voltage supplied during a previous frame period.

The above information disclosed in this Background section is only for understanding of the background of the inventive concepts, and, therefore, it may contain information that does not constitute prior art.

SUMMARY

Devices constructed according to exemplary implementations of the invention are capable of providing an organic light emitting display device capable of improving display quality by a swing of an initialization voltage at a predetermined interval and methods according to exemplary implementations are capable of providing a method for driving the organic light emitting display device.

Additional features of the inventive concepts will be set forth in the description which follows, and in part will be apparent from the description, or may be learned by practice of the inventive concepts.

According to one or more embodiments of the invention, an organic light emitting display device includes: a display unit including a plurality of pixels each coupled to a first scan line, a second scan line, and a data line; a scan driver configured to supply, to the display unit, a plurality of first scan pulses corresponding to a bias period and a second scan pulse corresponding to a data write period after the bias period through the respective first and second scan lines; an emission driver configured to supply an emission control signal to the display unit through emission control lines; a data driver configured to supply a data voltage to the display unit through the data lines; and a power supply configured to commonly supply, to the pixels, an initialization voltage, the initialization voltage having a voltage level switching between a first voltage level and a second voltage level in a preset period.

The power supply may be configured to supply the initialization voltage having the first voltage level while overlapping with some of the first scan pulses supplied by the scan driver to the first scan line, and the power supply may be configured to supply the initialization voltage having the second voltage level while overlapping with others of the first scan pulses supplied by the scan driver to the first scan line.

A period in which the scan driver supplies the second scan pulse to the first scan line and a period in which the power supply supplies the initialization voltage having the first voltage level may overlap with each other in the data write period.

A scan signal transferred to the second scan line may correspond to a scan signal transferred to the first scan line shifted by one horizontal period.

The power supply may be configured to supply the initialization voltage having the first voltage level and the initialization voltage having the second voltage level alternately, corresponding to the respective first scan pulses supplied to the first scan line during the bias period.

The first voltage level may be a negative voltage, and the second voltage level may be a positive voltage.

The scan driver may be configure to sequentially supply a scan signal to pixel lines, and the scan driver may be configured to skip the supply of the scan signal to the display unit for every preset timing.

The scan signal to be supplied to the display unit is additionally shifted by a preset shift period from the scan signal of a previous pixel line at an interval of preset pixel lines.

The power supply may be configured to switch the voltage level of the initialization voltage every two horizontal periods.

The emission driver may be configured to sequentially supply the emission control signal to pixel lines, and the emission driver may be configured to skip the supply of the emission control signal to the display unit for every preset timing.

The scan driver may supply the first scan pulses to the first scan line, the power supply may be configured to supply the initialization voltage to a gate electrode of a driving transistor included in a pixel corresponding to the first scan line.

The power supply may be configured to supply the initialization voltage having the first voltage level and the initialization voltage having the second voltage level alternately, to the gate electrode of the driving transistor in response to the first scan pulses supplied to the first scan line in the bias period.

The data voltage of previous pixel lines may be supplied to the driving transistor in response to the first scan pulses supplied to the second scan line in the bias period.

The data write period may include an initialization period, in which the scan driver is configured to supply the second scan pulse to the first scan line and a write period, in which the scan driver is configured to supply the second scan pulse to the second scan line, and the power supply may be configured to supply the initialization voltage having the first voltage level in the initialization period.

The pixel may be configured to supply the data voltage of the pixel corresponding to a current first scan line to the driving transistor in response to receiving the second scan pulse supplied to the second scan line in the write period.

According to one or more embodiments of the invention, a method for driving an organic light emitting display device, the method including: supplying an initialization voltage of a current frame to a pixel in response to a plurality of first scan pulses supplied through a first scan line during a bias period of the current frame; supplying a previous data voltage to the pixel in response to the first scan pulses supplied to a second scan line during the bias period, the previous data voltage being a data voltage of a previous pixel line; supplying the initialization voltage having a first voltage level to the pixel in response to a second scan pulse supplied through the first scan line in an initialization period of the current frame subsequent to the bias period; supplying a current data voltage to the pixel in response to the second scan pulse supplied through the second scan line in a data write period of the current frame subsequent to the initialization period, the current data voltage being a data voltage of the pixel; and emitting light with a grayscale corresponding to the current data voltage in response to an emission control signal supplied to an emission control line, wherein the initialization voltage has a voltage level switching between the first voltage level and a second voltage level larger than the first voltage level.

The initialization voltage having the first voltage level may be supplied overlapping with supplying of some of the first scan pulses to the first scan line, and the initialization voltage having the second voltage level may be supplied overlapping with supplying of the others of the first scan pulses supplied to the first scan line.

The first voltage level may be a negative voltage, and the second voltage level may be a positive voltage.

The first scan pulses and the second scan pulse transferred to the second scan line may be the first scan pulses and the second scan pulses transferred to the first scan line respectively shifted by one horizontal period.

The initialization voltage may be supplied to a gate electrode of a driving transistor included in the pixel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
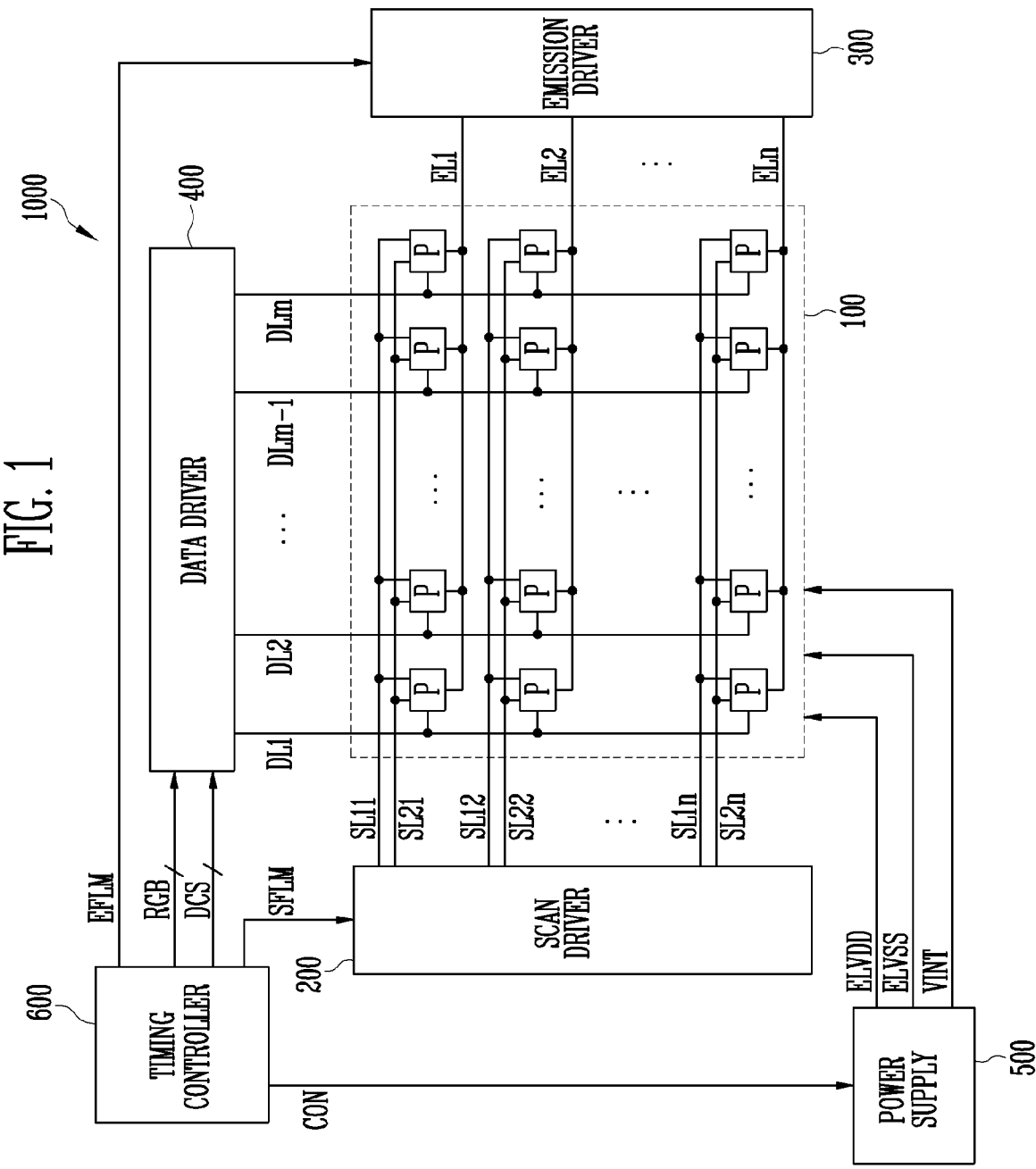
FIG. 1 is a block diagram illustrating an organic light emitting display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram illustrating an organic light emitting display device 1000 according to an exemplary embodiment.

Referring to FIG. 1, the organic light emitting display device 1000 may include a display unit 100, a scan driver 200, an emission driver 300, a data driver 400, a power supply 500, and a timing controller 600.

The display device 1000 may include a plurality of first scan lines SL11 to SL1$n$, a plurality of second scan lines SL21 to SL2$n$, a plurality of emission control lines EL1 to ELn, and a plurality of data lines DL1 to DLm, and include a plurality of pixels P respectively coupled to the first scan lines SL11 to SL1$n$, the second scan lines SL21 to SL2$n$, the emission control lines EL1 to ELn, and the data lines DL1 to DLm (n and m are integers larger than 1). Each of the pixels P may include a driving transistor and a plurality of switching transistors.

The scan driver 200 may sequentially supply a scan signal to the pixels P through the first scan lines SL11 to SLln and the second scan lines SL21 to SL2$n$, based on a scan start signal SFLM. The scan driver 200 receives the scan start signal SFLM, at least one clock signal, and the like from the timing controller 600.

In an exemplary embodiment, the scan signal may have a plurality of first scan pulses supplied in a bias period and a second scan pulse supplied in a data write period. The first scan pulses and the second scan pulse may correspond to a gate-on voltage at which the transistors included in the pixels P are turned on. Also, the first scan pulses and the second pulse may have the same voltage level and the same pulse width. In an example, when the transistors included in the pixels P are implemented with a P-channel metal oxide semiconductor (PMOS) transistor, the gate-on voltage may be set to a logic low level. When the transistors included in the pixels P are implemented with an N-channel metal oxide semiconductor (NMOS) transistor, the gate-on voltage may be set to a logic high level.

In an exemplary embodiment, a scan signal transferred to each scan line may be a signal obtained by shifting a scan signal transferred to each first scan line by one horizontal period. For example, a scan signal transferred to a first scan line may be equal to that transferred to a second scan line on a previous pixel line. A pixel line refers to a line of pixels (e.g., a pixel row) commonly coupled to one first scan line and one second scan line.

In an exemplary embodiment, the scan driver 200 may skip the supply of a scan signal to the display unit 100 for every preset timing. In other words, scan signals may be not provided to the display unit 100 and discarded for every predetermined interval. For example, a scan signal may be sequentially supplied to predetermined consecutive pixel lines at an interval of one horizontal period, and a scan signal shifted by two horizontal periods or more from that of a previous pixel line may be supplied to a corresponding pixel line at an interval of a preset pixel line.

The emission driver 300 may sequentially supply an emission control signal to the pixels P through the emission control lines EL1 to ELn, based on an emission control start signal EFLM. The emission driver 300 receives the emission control start signal EFLM, a clock signal, and the like from the timing controller 600. The emission control signal may divide one frame into an emission period and a non-emission period with respect to pixel lines.

In an exemplary embodiment, like the scan signal, the emission driver 300 may skip the supply of an emission control signal to the display unit 100 for every preset timing. In other words, emission control signals may be not provided to the display unit 100 and discarded for every predetermined timing. For example, an emission control signal may be sequentially supplied to consecutive pixel lines at an interval of one horizontal period, and an emission control signal shifted by two horizontal periods or more from that of a previous pixel line may be supplied to a corresponding pixel line at an interval of preset pixel lines.

The data driver 400 may receive a data control signal DCS and an image data signal RGB from the timing controller 600. The data driver 400 may supply a data signal (data voltage) to the pixels P through the data lines DL1 to DLm, based on the data control signal DCS and the image data signal RGB. In an exemplary embodiment, in one frame, a data voltage of a corresponding pixel P may be supplied to the corresponding pixel P in synchronization with each of the second scan pulses applied to the second scan lines SL21 to SL2n.

The timing controller 600 may control driving of the scan driver 200, the emission driver 300, the data driver 400, and the power supply 500, based on timing signals supplied from the outside. The timing controller 600 may supply a control signal including the scan start signal SFLM, a scan clock signal, and the like to the scan driver 200, and supply a control signal including the emission control start signal EFLM, an emission control clock signal, and the like to the emission driver 300. The data control signal DCS for controlling the data driver 400 may include a source start signal, a source output enable signal, a source sampling clock, and the like.

The power supply 500 may generate a first power voltage ELVDD, a second power voltage ELVSS, and an initialization voltage VINT, based on a power supply control signal CON received from the timing controller 600, and provide the generated voltages to the display unit 100. In an exemplary embodiment, the power supply 500 may commonly supply the initialization voltage VINT switched between a first voltage level and a second voltage level to the pixels P. The initialization voltage VINT is a voltage for initializing a gate voltage of a driving transistor included in the pixel P and/or an anode voltage of an organic light emitting diode included in the pixel P, and may be commonly supplied to the whole display unit 100. In an example, the initialization voltage VINT may be changed or switched for every two horizontal periods. However, this is merely illustrative, and the changing period of the initialization voltage VINT is not limited thereto. Also, the initialization voltage VINT may be generated by the data driver 400 and be provided to the display unit 100.

The voltage level of the initialization voltage VINT may determine a bias state of the driving transistor during a bias period. Accordingly, during the bias period, each of the pixels P may have a bias that alternately has an on-bias state and an off-bias state.

Figure 2:
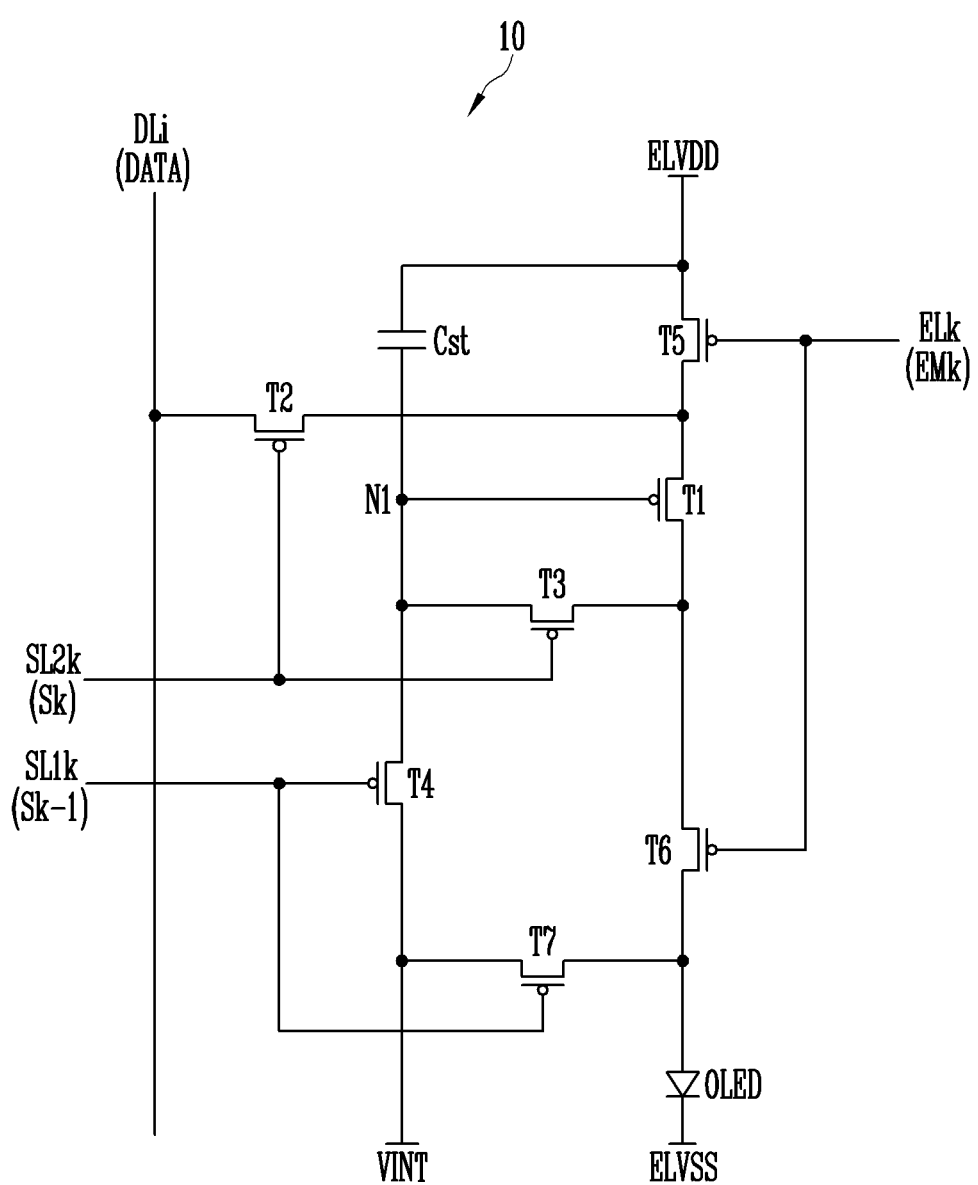
FIG. 2 is a circuit diagram illustrating an example of a pixel included in the organic light emitting display device of FIG. 1.

FIG. 2 is a circuit diagram illustrating an example of the pixel 10 included in the organic light emitting display device 1000 of FIG. 1.

For convenience of description, a pixel 10 coupled to an ith data line DLi, a first scan line SL1$k$ corresponding to the $k^{th}$ pixel line, a second scan line SL2$k$ corresponding to the $k^{th}$ pixel line, and a kth emission control line ELk will be illustrated in FIG. 2 (i and k are natural numbers of 2 or more).

Referring to FIG. 2, the pixel 10 may include an organic light emitting diode OLED, first, second, third, fourth, fifth, sixth, and seventh transistors T1, T2, T3, T4, T5, T6, and T7, and a storage capacitor Cst.

An anode electrode of the organic light emitting diode OLED may be coupled to the sixth and seventh transistors T6 and T7, and a cathode electrode of the organic light emitting diode OLED may be coupled to a second power voltage ELVSS. The organic light emitting diode OLED may generate light with a predetermined luminance corresponding to an amount of current supplied from a driving transistor (i.e., the first transistor T1).

The seventh transistor T7 may be coupled between an initialization voltage VINT and the anode electrode of the organic light emitting diode OLED. A gate electrode of the seventh transistor T7 may be coupled to the first scan line SL1$k$ corresponding to the $k^{th}$ pixel line. The seventh transistor T7 may be turned on when a (k−1)$^{th}$ scan signal Sk−1 (Gik of FIG. 3) is supplied to the first scan line SL1$k$ corresponding to the $k^{th}$ pixel line, to supply the initialization voltage to the anode electrode of the organic light emitting diode OLED. In an exemplary embodiment, the (k−1)$^{th}$ scan signal Sk−1 supplied to the first scan line SL1$k$ corresponding to the $k^{th}$ pixel line may be equal to that supplied to a second scan line SL2$k$ corresponding to the (k−1)$^{th}$ pixel line.

The sixth transistor T6 may be coupled between the first transistor T1 and the organic light emitting diode OLED. A gate electrode of the sixth transistor T6 may be coupled to the kth emission control line ELk. The sixth transistor T6 may be turned on when an emission control signal EMk is supplied to the kth emission control line ELk, and be turned off otherwise. For example, the sixth transistor T6 may be turned on in a gate-on period of the emission control signal EMk supplied to the kth emission control line ELk, and be turned off in a gate-off period of the emission control signal EMk.

The fifth transistor T5 may be coupled between a first power voltage ELVDD and the first transistor T1. A gate electrode of the fifth transistor T5 may be coupled to the kth emission control line ELk. The fifth transistor T5 may be turned on when the emission control signal EMk is supplied to the kth emission control line ELk, and be turned off otherwise.

A first electrode of the first transistor (driving transistor) T1 may be coupled to the first power voltage ELVDD via the fifth transistor T5, and a second electrode of the first transistor T1 may be coupled to the anode electrode of the organic light emitting diode OLED via the sixth transistor T6. A gate electrode of the first transistor T1 may be coupled to a first node N1. The first transistor T1 may control an amount of current flowing from the first power voltage ELVDD to the second power voltage ELVSS via the organic light emitting diode OLED, corresponding to a voltage of the first node N1.

The third transistor T3 may be coupled between the second electrode of the first transistor T1 and the first node N1. A gate electrode of the third transistor T3 may be coupled to the second scan line SL2k corresponding to the $k^{th}$ pixel line. The third transistor T3 may be turned on when a $k^{th}$ scan signal Sk is supplied to the second scan line SL2k corresponding to the $k^{th}$ pixel line, to electrically couple the second electrode of the first transistor T1 and the first node N1. Therefore, when the third transistor T3 is turned on, the first transistor T1 may be diode-coupled. A threshold voltage compensation operation of the first transistor T1 may be performed.

In an example, the $k^{th}$ scan signal Sk supplied to the second scan line SL2k corresponding to the $k^{th}$ pixel line may be a signal obtained by shifting the $(k-1)^{th}$ scan signal Sk−1 supplied to the first scan line SL1k corresponding to the $k^{th}$ pixel line by one horizontal period.

The fourth transistor T4 may be coupled between the first node N1 and the initialization voltage VINT. A gate electrode of the fourth transistor T4 is coupled to the first scan line SL1k corresponding to the $k^{th}$ pixel line. The fourth transistor T4 may be turned on when a $(k-1)^{th}$ scan signal Sk−1 is supplied to the first scan line SL1k corresponding to the $k^{th}$ pixel line, to supply the initialization voltage VINT to the first node N1.

The initialization voltage VINT may have a first voltage level or a second voltage level larger than the first voltage level. Therefore, the voltage of the first node N1, i.e., the gate electrode of the first transistor T1 may have the first voltage level or the second voltage level. In an exemplary embodiment, when the initialization voltage VINT having the first voltage level is supplied, the first transistor T1 that is a PMOS transistor may be in the on-bias state. When the initialization voltage VINT having the second voltage level is supplied, the first transistor T1 may be in the off-bias state.

The second transistor T2 may be coupled between the data line DLi and the first electrode of the first transistor T1. A gate electrode of the second transistor T2 may be coupled to the second scan line SL2k corresponding to the $k^{th}$ pixel line. The second transistor T2 may be turned on when a scan signal is supplied to the second scan line SL2k corresponding to the $k^{th}$ pixel line, to electrically couple the data line DLi and the first electrode of the first transistor T1.

The storage capacitor Cst may be coupled between the first power voltage ELVDD and the first node N1. The storage capacitor Cst may store a voltage corresponding to a data signal and a threshold voltage of the first transistor T1.

Figure 3:
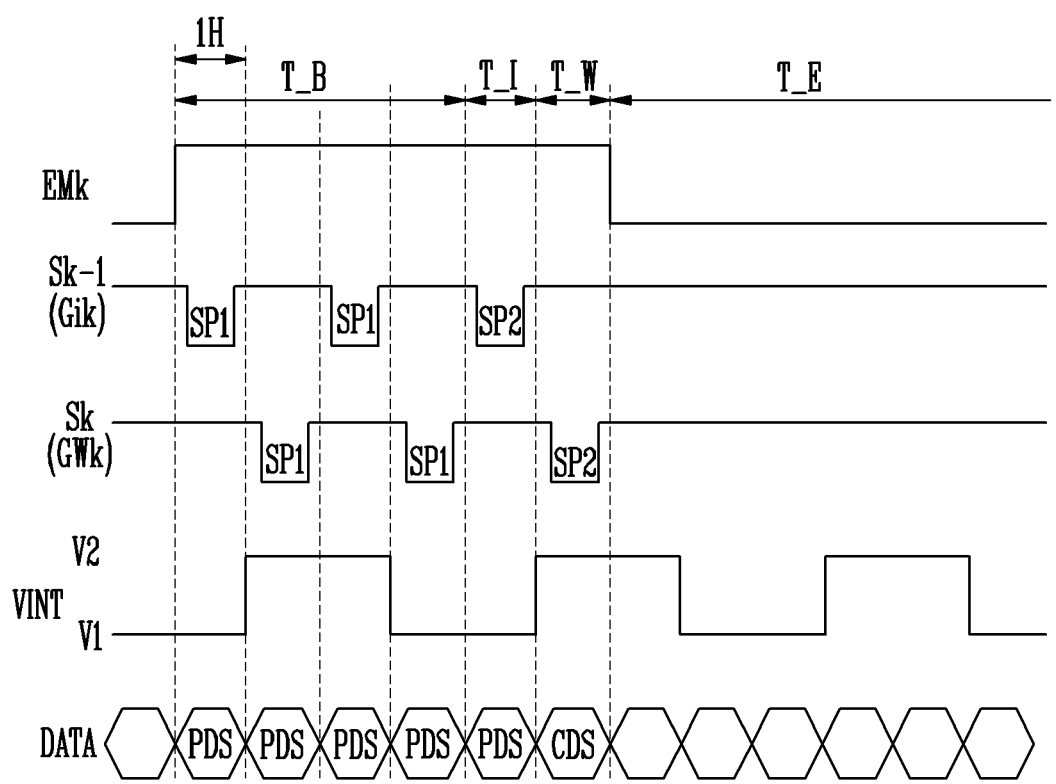
FIG. 3 is a timing diagram of an example of signals supplied to the pixel of FIG. 2 to illustrate a method for driving the organic light emitting display device including the pixel of FIG. 2.

FIG. 3 is a timing diagram of an example of signals supplied to the pixel of FIG. 2 to illustrate a method for driving the organic light emitting display device including the pixel of FIG. 2.

Specifically, FIG. 3 illustrates an example of driving the pixel of FIG. 2, which is disposed on a ith column and a kth row.

Referring to FIGS. 2 and 3, the initialization voltage VINT may have two different voltage levels including a first voltage level V1 and a second voltage level V2 larger than the first voltage level V2 in a preset period.

In an exemplary embodiment, the voltage level of the initialization voltage VINT may be changed for every two horizontal periods 2H. However, this is merely illustrative, and the changing period of the initialization voltage is not limited thereto.

In an exemplary embodiment, when the first transistor T1 (i.e., the driving transistor) is a PMOS transistor, the first voltage level V1 may be a negative voltage sufficiently low to set the first transistor T1 in a complete on-bias state, and the second voltage level V2 may be a positive voltage sufficiently high to set the first transistor T1 in a complete off-bias state. For example, the first voltage level V1 may be set to about −3.5 V, and the second voltage level V2 may be set to about 6.5 V.

Meanwhile, the switching of voltage level of the initialization voltage VINT is irrelevant to the $k^{th}$ scan signal Sk supplied to the second scan like SL2k.

First, the emission control signal EMk having a logic high level may be supplied to the emission control line ELk, so that the fifth and sixth transistors T5 and T6 are turned off. That is, during this period, the pixel 10 is set to a non-emission state.

Subsequently, during a bias period T_B, the $k^{th}$ and $(k-1)^{th}$ scan signals Sk−1 and Sk each having a plurality of first scan pulses SP1, may be sequentially supplied to the first scan line SL1k and the second scan line SL2k corresponding to the $k^{th}$ pixel line, respectively. The $k^{th}$ scan signal Sk supplied to the second scan line SL2k corresponding to the $k^{th}$ pixel line may be a signal obtained by shifting the $(k-1)^{th}$ scan signal Sk−1 supplied to the first scan line SL1k corresponding to the $k^{th}$ pixel line by one horizontal period 1H. In addition, the $(k-1)^{th}$ scan signal Sk−1 supplied to the first scan line SL1k corresponding to the $k^{th}$ pixel line is a gate initialization signal Gik for initializing a gate voltage of the first transistor T1 and an anode voltage of the organic light emitting diode OLED to a predetermined voltage level, and the $k^{th}$ scan signal Sk supplied to the second scan line SL2k corresponding to the $k^{th}$ pixel line may be defined as a gate write signal GWk for writing a data voltage DATA in the first transistor T1.

Although FIG. 3 illustrates that each of the scan signals Sk−1 and Sk has three first scan pulses SP1, the number of first scan pulses SP1 is not limited thereto.

When the first scan pulse SP1 is supplied to the first scan line SL1k, the fourth and seventh transistors T4 and T7 may be turned on. When the fourth transistor T4 is turned on, the initialization voltage VINT may be supplied to the gate electrode of the first transistor T1 (i.e., the first node N1). Also, when the seventh transistor T7 is turned on, the initialization voltage VINT may be supplied to the anode electrode of the organic light emitting diode OLED.

The initialization voltage VINT having the first voltage level V1 or the initialization voltage VINT having the second voltage level V2 may be supplied to the gate electrode of the first transistor T1 in response to the first scan pulse SP1 supplied to the first scan line SL1k. In an exemplary embodiment, as shown in FIG. 3, during the bias period T_B, the initialization voltage VINT having the first voltage level V1 and the initialization voltage VINT having the second voltage level V2 may be alternately supplied to the gate electrode of the first transistor T1 in response to the first scan pulse SP1 supplied to the first scan line SL1k.

When the initialization voltage VINT having the first voltage level V1 is supplied to the gate electrode of the first transistor T1, the first transistor T1 may completely be in the on-bias state. When the initialization voltage VINT having the second voltage level V2 is supplied to the gate electrode of the first transistor T1, the first transistor T1 may completely be in the off-bias state.

When the first scan pulse SP1 is supplied to the second scan line SL2k during the bias period T_B, the second and third transistors T2 and T3 may be turned on. When the second transistor T2 is turned on, a previous data voltage PDS may be supplied to the first electrode of the first transistor T1. Also, when the third transistor T3 is turned on, the first transistor T1 may be diode-coupled. Here, the previous data voltage PDS refers to a data voltage supplied to a preset previous pixel line in a current frame. For example, the previous data voltage PDS of the pixel 10 may refer to a data voltage supplied to a pixel of a $(k-2)^{th}$ pixel line connected to the ith data line DLi.

The previous data voltage for grayscale expression may have a value larger than the first voltage level V1, and a characteristic of the first transistor T1 may be shifted toward an off-bias by the previous data voltage PDS.

According to a conventional organic light emitting display device, during the bias period T_B, the gate voltage of the first transistor T1 is repeatedly switched between the fixed initialization voltage VINT and the previous data voltage PDS to reduce the amount of a hysteresis change of the first transistor T1.

However, when the magnitude of the previous data voltage PDS is small (e.g., when the previous data voltage PDS is a data voltage corresponding to a white grayscale), the magnitude of an off-bias caused by the previous data voltage PDS is relatively small as compared with that of an on-bias caused by the existing initialization voltage VINT. Hence, the characteristic of the first transistor T1 is shifted in an unwanted direction according to the conventional technology, and an afterimage may be viewed.

On the other hand, the organic light emitting display device according to an exemplary embodiment performs driving that allows the first transistor T1 to alternately have the complete on-bias state and the complete off-bias state, using the varying initialization voltage VINT, during the bias period T_B, so that a constant operational characteristic of the first transistor T1 can be maintained and the adverse effect of the magnitude of previous data voltages PDS and/or an image of a previous frame may be minimized or reduced.

Thus, even when a white grayscale is expressed after a block grayscale is implemented, a high-quality image can be acquired without luminance degradation and any instantaneous afterimage.

In an exemplary embodiment, the initialization voltage VINT having the first voltage level V1 and the initialization voltage VINT having the second voltage level V2 may be alternately supplied to the gate electrode of the first transistor T1 in response to the first scan pulses SP1 supplied to the first scan like SL1k in the bias period T_B. For example, as shown in FIG. 3, after the initialization voltage VINT having the first voltage level V1 is applied to the gate electrode of the first transistor T1, the initialization voltage VINT having the second voltage level V2 may be applied to the gate electrode of the first transistor T1. Therefore, the state of the first transistor T1 may be changed to the complete off-bias state after the first transistor T1 becomes the complete on-bias state in the bias period T_B.

However, this is merely illustrative, and the sequence of bias states is not limited thereto. For example, the initialization voltage VINT having the first voltage level V1 may be applied to the gate electrode of the first transistor T1 after the initialization voltage VINT having the second voltage level V2 is applied to the gate electrode of the first transistor T1 in the bias period T_B.

Subsequently, a pixel initialization operation and a data write operation may be substantially performed in a data write period. In an exemplary embodiment, the data write period may include an initialization period T_I in which a second scan pulse SP2 of the scan signal Sk−2 is supplied to the first scan line SL1k and a write period T_W in which a second scan pulse SP2 of the $k^{th}$ scan signal Sk is supplied to the second scan line SL2k.

In the initialization period T_I, the second scan pulse SP2 may be supplied through the first scan line SL1k such that the fourth and seventh transistors T4 and T7 are turned on. The initialization period T_I is a period in which the gate voltage of the first transistor T1 and the anode voltage of the organic light emitting diode OLED are substantially initialized to write data.

The initialization voltage VINT may have the first voltage level V1 so as to initialize the gate voltage of the first transistor T1 and the anode voltage of the organic light emitting diode OLED. That is, the initialization period T_I and the period in which the initialization voltage VITN has the first voltage level may overlap with each other.

Subsequently, in the write period T_W, the second scan pulse SP2 of the kth scan signal Sk may be supplied through the second scan line SL2k, and a data voltage CDS corresponding to the pixel 10 may be supplied through the second scan line SL2k. The second and third transistors T2 and T3 may be turned on in response to the second scan pulse SP2 supplied to the second scan like SL2k. The first transistor T1 may be diode-coupled, and a compensation voltage CDS+Vth (Vth is a negative number) obtained by subtracting the threshold voltage of the first transistor T1 from the data voltage CDS corresponding to the pixel 10 may be applied to the gate electrode of the first transistor T1. Therefore, a driving voltage ELVDD and the compensation voltage CDS+Vth may be applied to both ends of the storage capacitor Cst, and charges corresponding to the difference between the voltages applied to both the ends of the storage capacitor Cst may be stored in the storage capacitor Cst.

Subsequently, in an emission period T_E, the emission control signal EMk supplied to the emission control line ELk has the logic low level, and the fifth and sixth transistors T5 and T6 may be turned on. Accordingly, the organic light emitting diode OLED may emit light with a luminance corresponding to the data voltage CDS.

As described above, in the organic light emitting display device and the method for driving the same, including the bias period T_B in which the plurality of first scan pulses SP1 are supplied, the voltage level of the initialization voltage VINT is periodically changed, so that the first transistor T1 can have the complete on-bias state and the complete off-bias state, which are alternately repeated, during the bias period T_B. Accordingly, the hysteresis characteristic of the first transistor T1 can be minimized or reduced, and an unnecessary change in characteristic of the first transistor T1 can be suppressed. Thus, an image with a desired luminance can be displayed regardless of a previous data voltage and a previous image. In particular, luminance degradation and an instantaneous afterimage, which occur when a white grayscale is expressed after a black grayscale is implemented, can be prevented.

Figure 4:
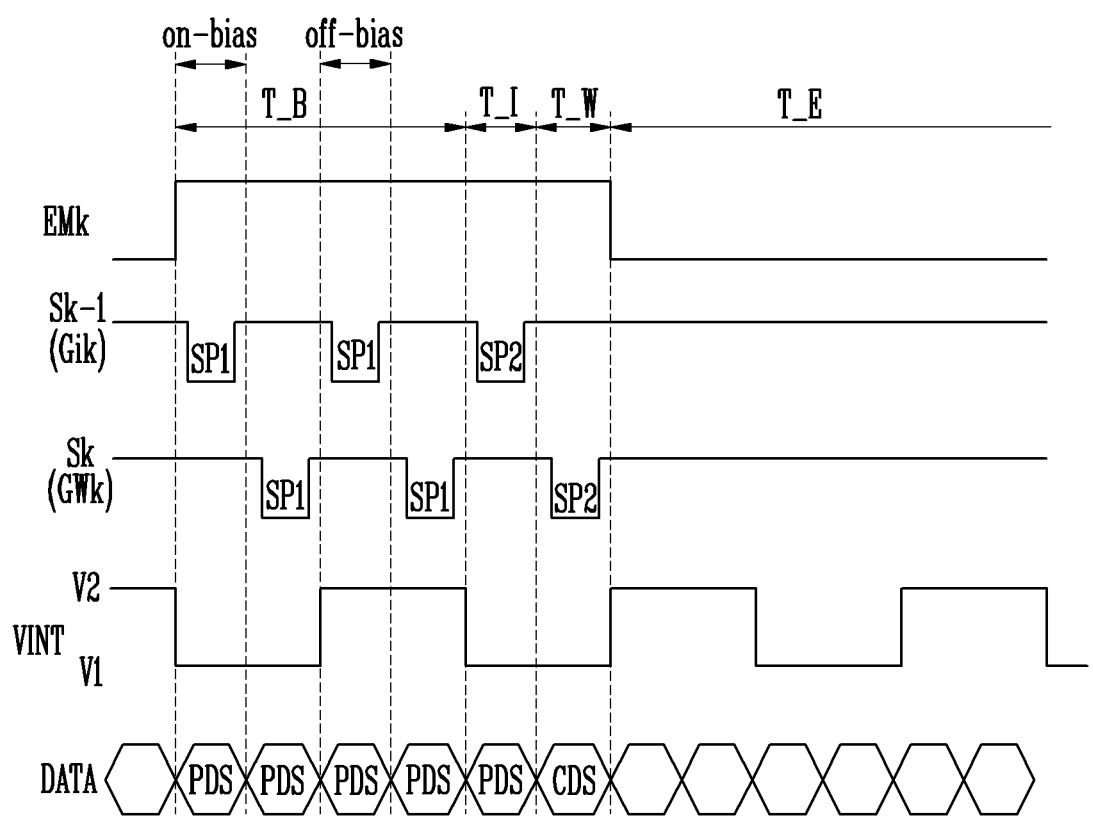
FIG. 4 is a timing diagram illustrating another example of signals supplied to the pixel of FIG. 2.

FIG. 4 is a timing diagram illustrating another example of signals supplied to the pixel of FIG. 2.

The signals according to this embodiment are substantially identical to the signals supplied to the pixel according to FIG. 3 and the method for driving the pixel except the level change timing of the initialization voltage VINT.

Therefore, identical or corresponding components are designated by like reference numerals, and their overlapping descriptions will be omitted.

Referring to FIGS. 2, 3, and 4, the initialization voltage VINT may have two different voltage levels including a first voltage level V1 and a second voltage level V2 larger than the first voltage level V1 in a preset period.

In a bias period T_B, the initialization voltage VINT having the first voltage level V1 or the initialization voltage VINT having the second voltage level V2 may be supplied to the gate electrode of the first transistor (driving transistor) T1 in response to the first scan pulses SP1 of the gate initialization signal Gik. As shown in FIG. 4, in the bias period T_B, the first transistor T1 may have the complete off-bias state after the first transistor T1 has the complete on-bias state. Accordingly, the hysteresis characteristic of the first transistor T1 can be minimized or reduced, and an unnecessary change in characteristics of the first transistor T1 can be suppressed.

Figure 5:
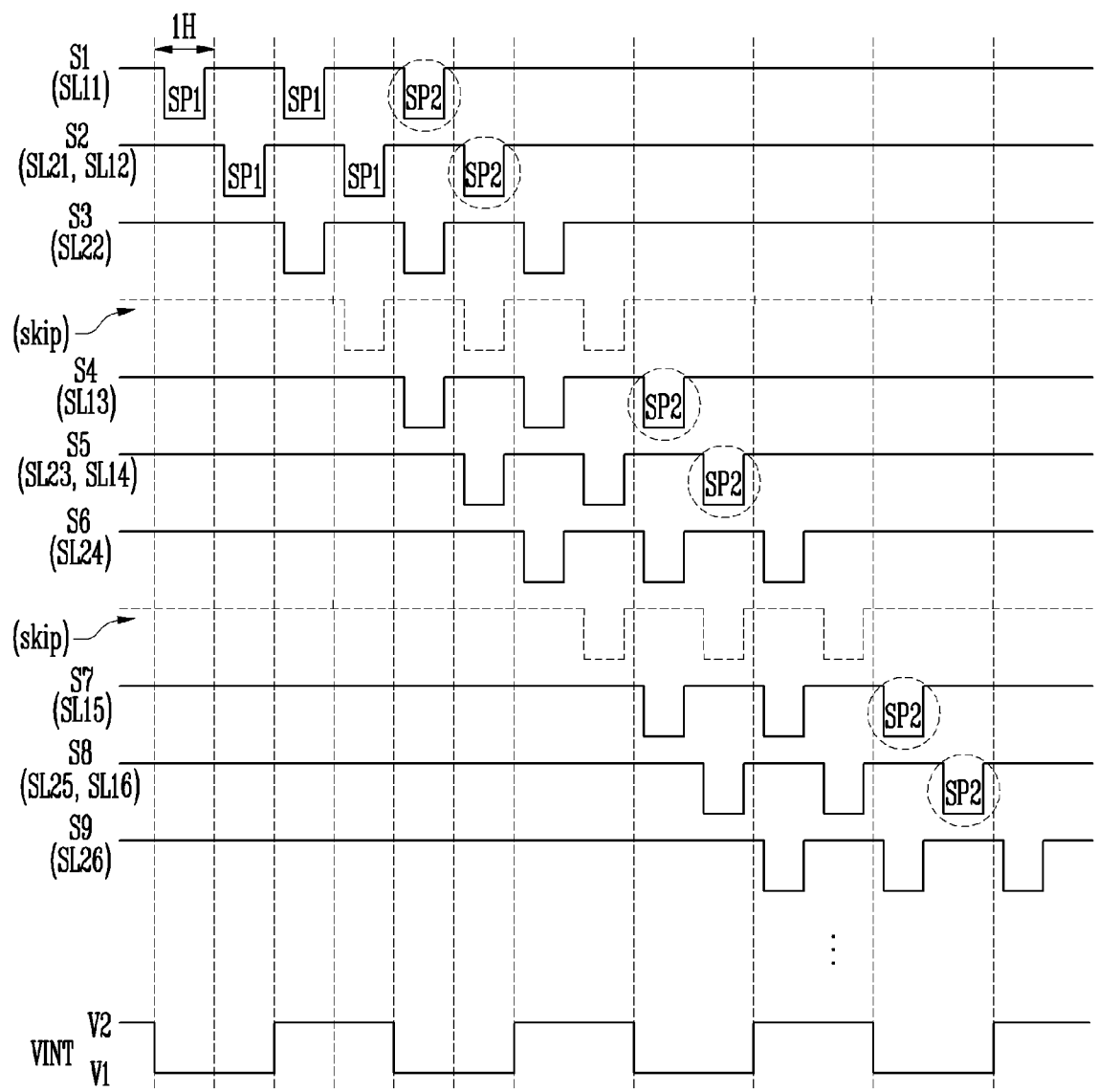
FIG. 5 is a timing diagram illustrating an example of signals supplied to a display unit included in the organic light emitting display device of FIG. 1.
Figure 6:
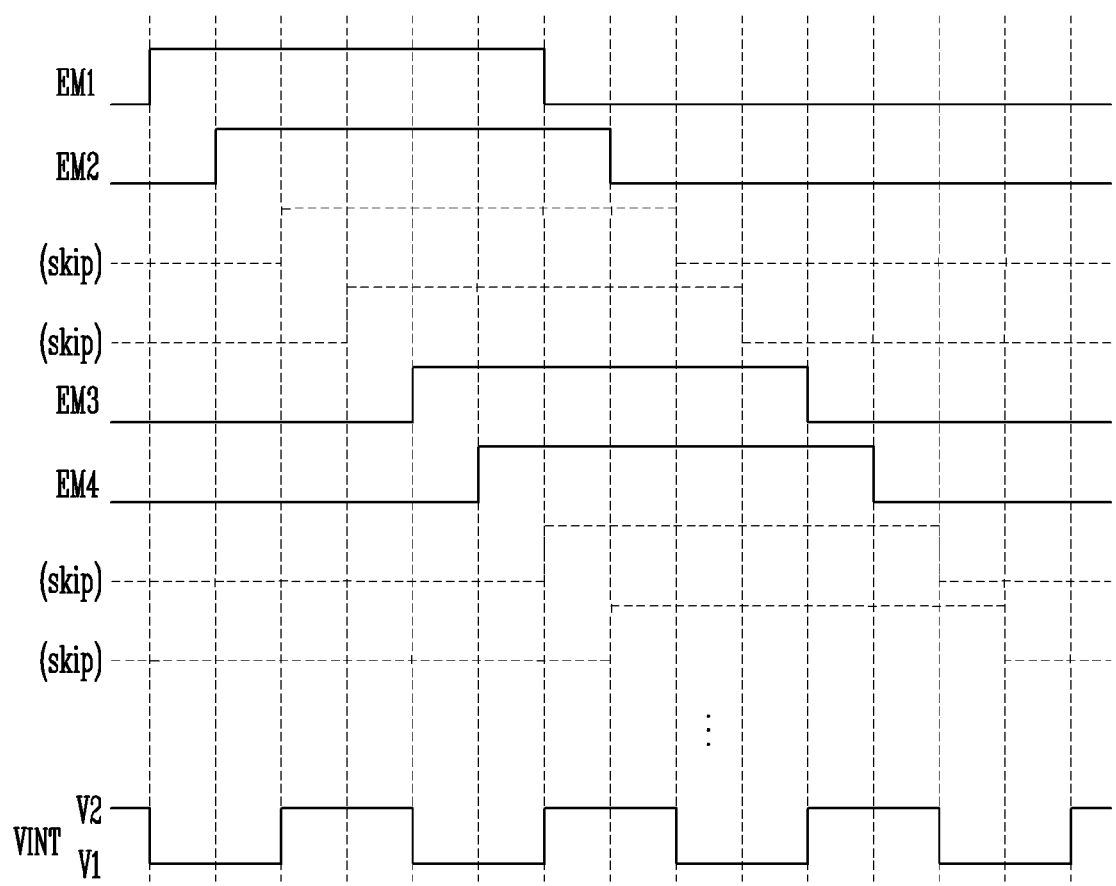
FIG. 6 is a timing diagram illustrating an example of signals supplied to the display unit included in the organic light emitting display device.

FIG. 5 is a timing diagram illustrating an example of signals supplied to the display unit included in the organic light emitting display device of FIG. 1. FIG. 6 is a timing diagram illustrating an example of signals supplied to the display unit included in the organic light emitting display device.

Referring to FIGS. 5 and 6, scan signals S1, S2, S3, S4, S5, S6, S7, S8, and S9 and emission control signals EM1, EM2, EM3, and EM4 may be sequentially supplied to the corresponding lines of pixels. The initialization voltage VINT may have two different voltage levels including a first voltage level V1 and a second voltage level V2 larger than the first voltage level V1 in a preset period.

In order to perform a pixel initialization operation in an initialization period, second scan pulses SP2 supplied to first scan lines SL11, SL12, SL13, SL14, . . . of the respective pixels may overlap with periods in which the initialization voltage VINT has the first voltage level V1. Some timings of the scan signals may be skipped to perform the driving.

A first scan signal S1 may be supplied to a first scan line SL11 corresponding to a first pixel line.

A second scan signal S2 may be supplied to a second scan line SL21 corresponding to the first pixel line and a first scan line S12 corresponding to a second pixel line.

A third scan signal S3 may be supplied to a second scan line SL22 corresponding to the second pixel line. However, the third scan signal S3 is not supplied to a first scan line SL13 corresponding to a third pixel line. That is, since the second scan pulse SP2 of the third scan signal S3 overlaps with a period in which the initialization VINT has the second voltage level V2, the second scan pulse SP2 of the third scan signal S3 cannot be used in an initialization operation of a predetermined pixel (e.g., pixels of the third pixel line).

After a predetermined timing is skipped, a fourth scan signal S4 may be supplied to the first scan line SL13 corresponding to the third pixel line.

As described above, in an exemplary embodiment, the supply of one of the scan signals S1, S2, S3, S4, S5, S6, S7, S8, and S9 to the display unit 100 may be skipped for every preset timing. In other words, the one of the scan signals S1, S2, S3, S4, S5, S6, S7, S8, and S9 may be additionally shifted by a preset shift period from that of a previous pixel line at an interval of preset pixel lines to be supplied to the display unit 100. The skip timing or additional shift interval of the scan signal may rely on a switching period of the initialization voltage VINT.

For example, as shown in FIG. 5, when the initialization voltage VINT is changed for every two horizontal periods 2H, the scan signal may be further shifted by one horizontal period 1H at an interval of two pixel lines to be supplied to the display unit 100. Accordingly, the second scan pulse SP2 supplied in the initialization period of each pixel line overlaps with the period in which the initialization voltage VINT has the second voltage level V2, and the initialization of the driving transistor and the organic light emitting diode can be performed.

The emission control signals EM1, EM2, EM3, and EM4 may be sequentially supplied corresponding to the above-described skip of the scan signals S1, S2, S3, S4, S5, S6, S7, S8, and S9.

A period in which a first emission control signal EM1 has the logic high level may correspond to the first and second scan signals S1 and S2, and a period in which a second emission control signal EM2 has the logic high level may correspond to second and third scan signals S2 and S3.

Similarly, a period in which a third emission control signal EM3 has the logic high level may correspond to the fourth and fifth scan signals S4 and S5. The supply of the emission control signal to the display unit 100 may be skipped by the skip of the scan signal for every preset timing. That is, the timings of emission control signals EM1, EM2, EM3, . . . may be controlled so as to secure the bias period, the initialization period, and the write period, which are described above.

Figure 7:
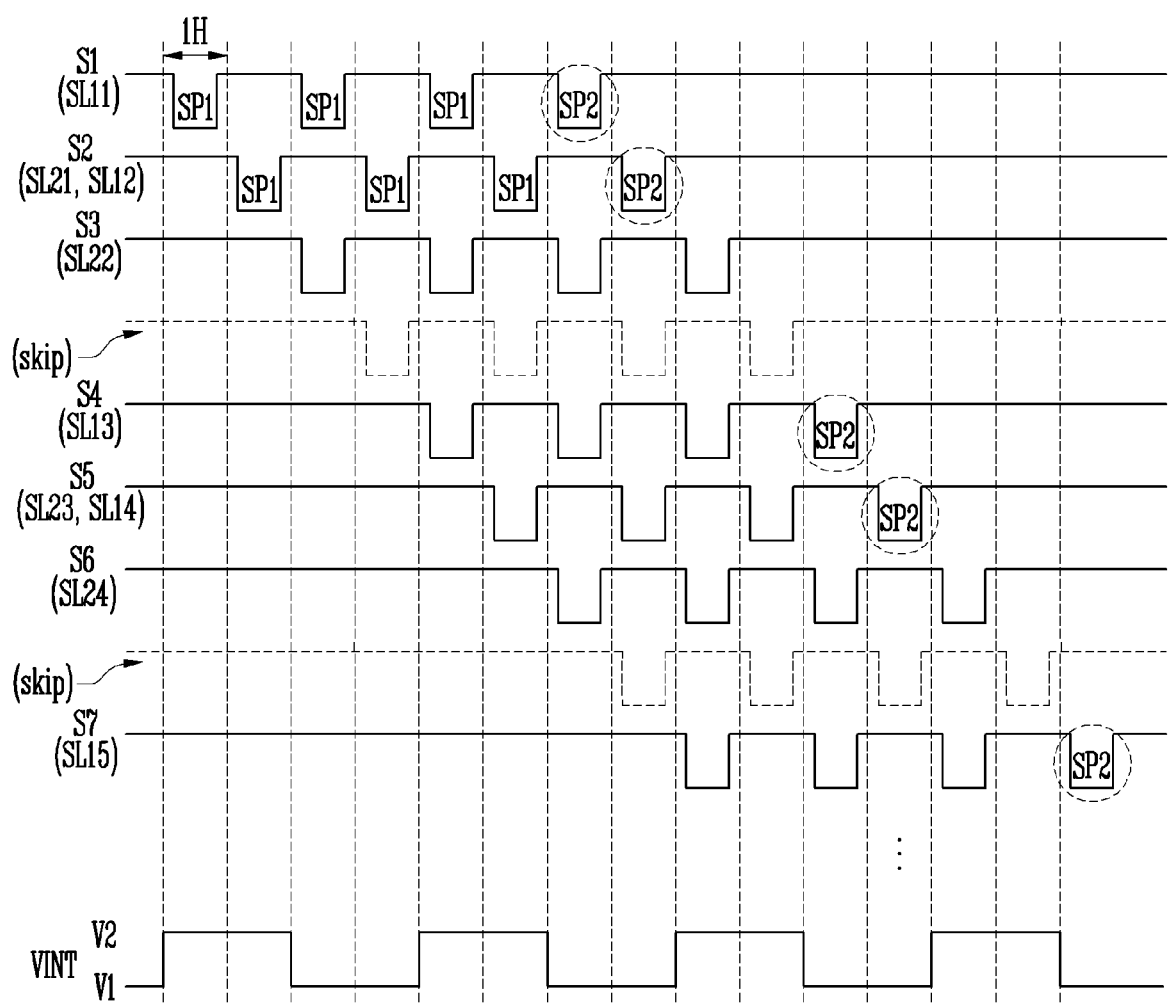
FIG. 7 is a timing diagram illustrating another example of the signals supplied to the display unit included in the organic light emitting display device of FIG. 1.
Figure 8:
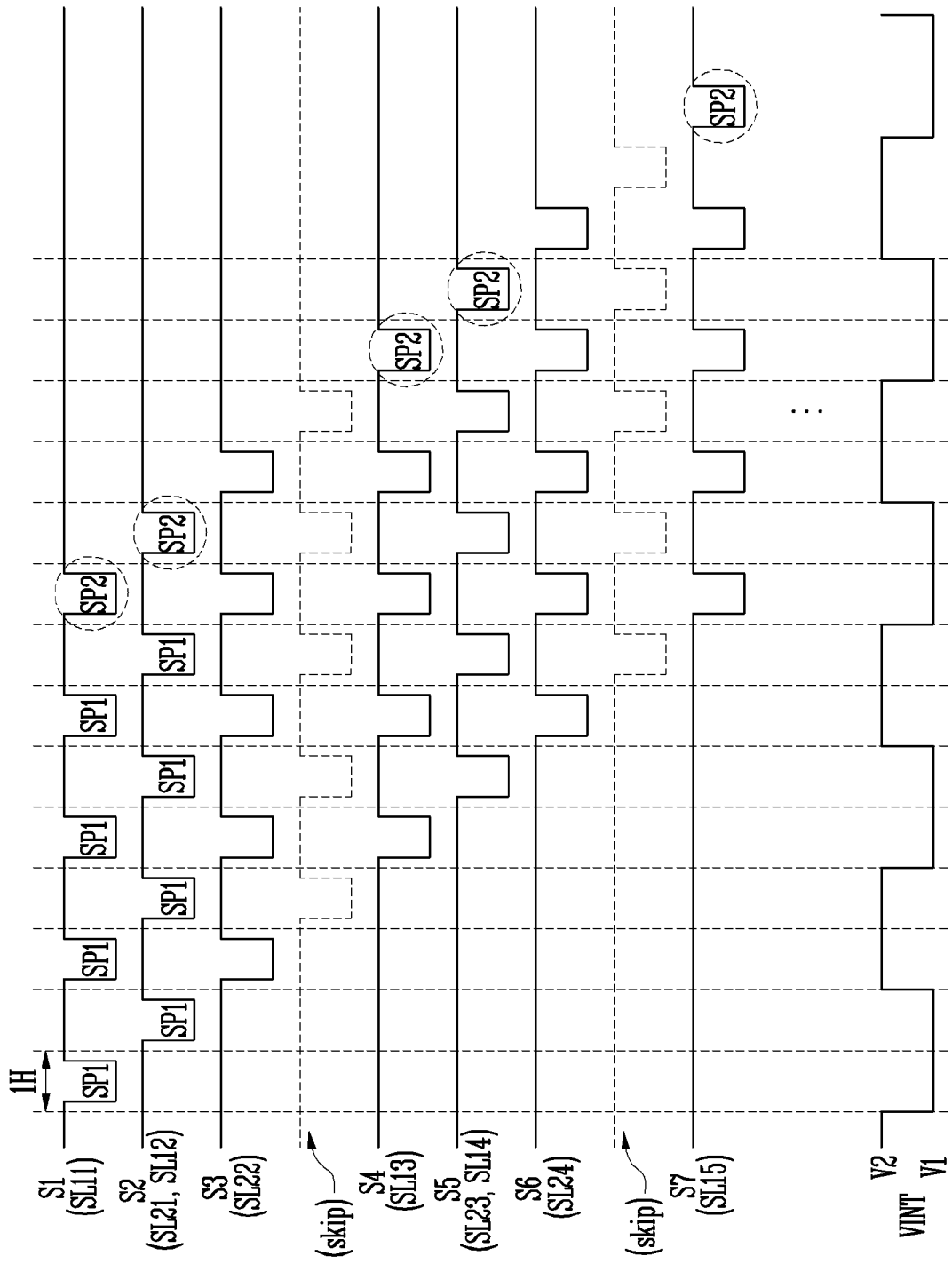
FIG. 8 is a timing diagram illustrating still another example of the signals supplied to the display unit included in the organic light emitting display device of FIG. 1.

FIG. 7 is a timing diagram illustrating another example of the signals supplied to the display unit included in the organic light emitting display device of FIG. 1. FIG. 8 is a timing diagram illustrating still another example of the signals supplied to the display unit included in the organic light emitting display device of FIG. 1.

Methods for driving the organic light emitting devices according to these exemplary embodiments are substantially identical to the signals supplied to the pixel according to FIG. 3 and the method for driving the pixel except the number of first scan pulses SP1 of a scan signal. Therefore, identical or corresponding components are designated by like reference numerals, and their overlapping descriptions will be omitted.

Referring to FIGS. 7 and 8, scan signals S1, S2, S3, S4, S5, S6, and S7 may be sequentially supplied corresponding to pixel lines.

The initialization voltage VINT may have two different voltage levels including a first voltage level V1 and a second voltage level V2 larger than the first voltage level V1 in a preset period. Each of the scan signals S1, S2, S3, S4, S5, S6, and S7 may include a plurality of first scan pulses SP1 and a second scan pulse SP2.

In order to perform a pixel initialization operation in an initialization period, second scan pulses supplied to first scan lines SL11, SL12, SL13, SL14, . . . of the respective pixels may overlap with periods in which the initialization voltage VINT has the first voltage level V1 (corresponding to portions indicated by circles).

In an exemplary embodiment, as shown in FIG. 7, each of the scan signals S1, S2, S3, S4, S5, S6, and S7 may include three first scan pulses SP1. The state of the driving transistor of each pixel may be changed in a sequence of the off-bias state, the on-bias state, and the off-bias state due to fluctuation of the initialization voltage VINT.

As shown in FIG. 8, each of the scan signals S1, S2, S3, S4, S5, S6, and S7 may include four first scan pulses SP1. The state of the driving transistor of each pixel may be changed in a sequence of the on-bias state, the off-bias state, the on-bias state, and the off-bias state due to fluctuation of the initialization voltage VINT.

However, in FIGS. 7 and 8, the initialization voltage VINT is switched at an interval of two horizontal periods, and therefore, a scan signal may be skipped for every second pixel line.

As described above, the driving transistor (i.e., the first transistor T1 of FIG. 2) can have the complete on-bias state and the complete off-bias state, which are alternately repeated once or more. Accordingly, the hysteresis characteristic of the driving transistor can be minimized or reduced, and an unnecessary change in characteristic of the driving transistor can be suppressed.

Figure 9:
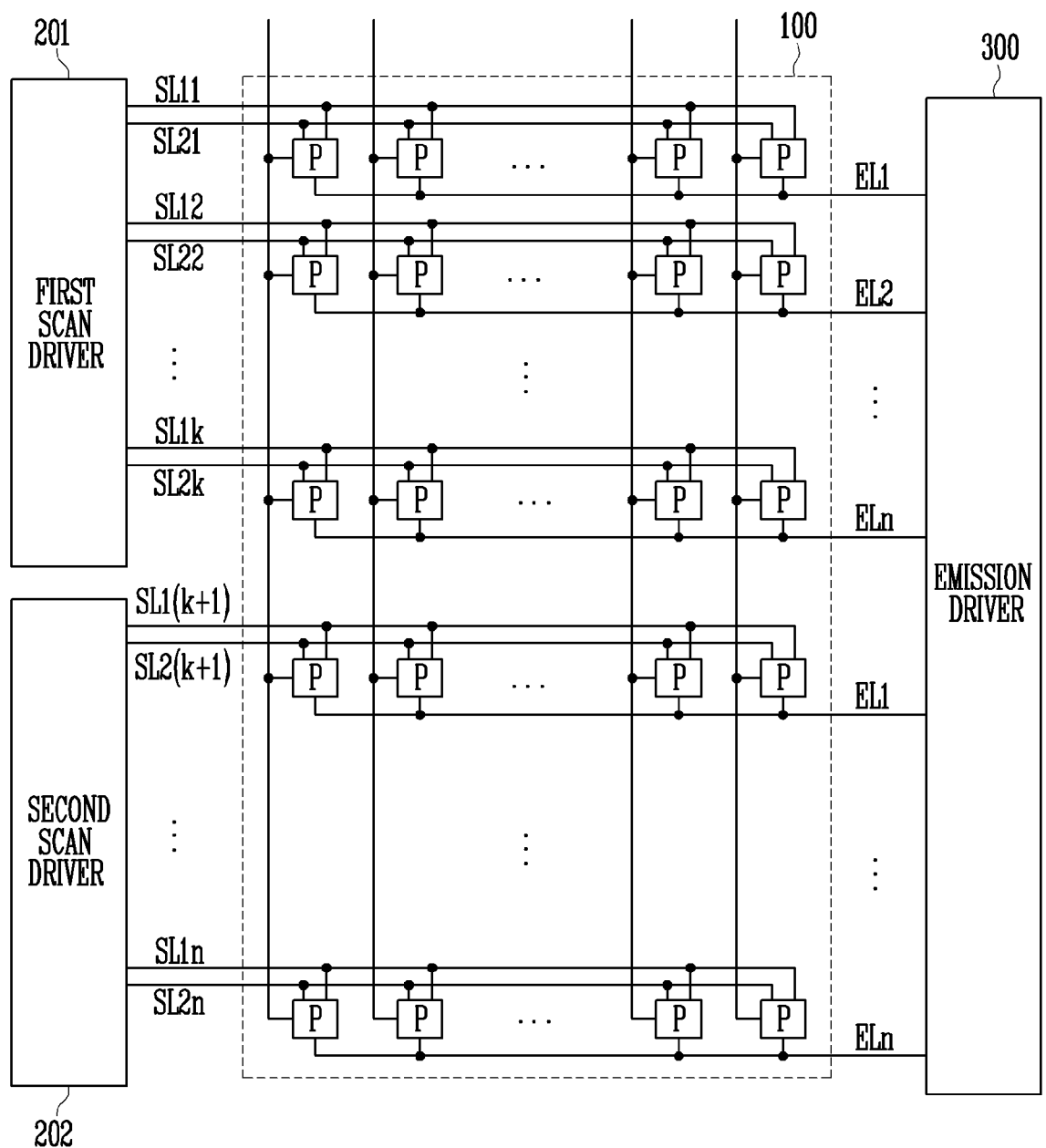
FIG. 9 is a block diagram illustrating another example of the organic light emitting display device of FIG. 1.

FIG. 9 is a block diagram illustrating another example of the organic light emitting display device of FIG. 1.

The organic light emitting display device according to this embodiment is substantially identical to the organic light emitting display device according to FIG. 1 except a manner that provides a scan signal to the display unit. Therefore, identical or corresponding components are designated by like reference numerals, and their overlapping descriptions will be omitted.

Referring to FIG. 9, the organic light emitting display device may include a first scan driver 201 and a second scan driver 202. FIG. 9 illustrates only some components of the organic light emitting display device.

The display unit 100 may be divided into two areas by the first scan driver 201 and the second scan driver 202, to display an image.

According to the driving illustrated in FIGS. 5, 7, and 8, an initialization operation is to be performed corresponding to the initialization voltage VINT that is a global voltage provided to all pixels at a common timing, and hence scan signals discarded at a certain interval exist. Therefore, a non-emission period of one frame may be increased by the discarded output signals (skipped scan signals).

In the exemplary embodiment of FIG. 9, scan signals can be independently supplied to the respective areas of the display unit 100, using the plurality of scan drivers 201 and 202. Thus, the hysteresis characteristic of the driving transistor can be minimized or reduced without any unnecessary increase in non-emission period, and image quality can be improved.

In exemplary embodiments, the scan driver 200 or the first and second drivers 201 and 202, the emission driver 300, the data driver 400, the power supply 500, the timing controller 600, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the scan driver 200 or the first and second drivers 201 and 202, the emission driver 300, the data driver 400, the power supply 500, the timing controller 600, and/or one or more components thereof may include or otherwise be associated with one or more memories (not shown) including code (e.g., instructions) configured to cause the scan driver 200 or the first and second drivers 201 and 202, the emission driver 300, the data driver 400, the power supply 500, the timing controller 600, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

According to the exemplary embodiments, the organic light emitting display device and the method for driving the same according to the present disclosure may have the voltage level of the initialization voltage VINT is periodically changed or switched, so that the first transistor (driving transistor) of each pixel can be in the complete on-bias state and the complete off-bias state, which are alternately repeated, during the bias period. Accordingly, the hysteresis characteristic of the first transistor can be minimized or reduced, and an unnecessary change in characteristic of the first transistor can be suppressed.

Some of the advantages that may be achieved by exemplary embodiments of the invention include displaying an image with a desired luminance regardless of a previous data voltage and a previous image. In particular, luminance degradation and an instantaneous afterimage, which occur when a white grayscale is expressed after a black grayscale is implemented, can be prevented or reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light emitting display device comprising:
a display unit including a plurality of pixels coupled to a first scan line, a second scan line, and a data line, each pixel including a driving transistor;
a scan driver configured to supply, to the display unit, a plurality of first scan pulses during a bias period and a second scan pulse during a data write period after the bias period through the respective first and second scan lines;
an emission driver configured to supply an emission control signal to the display unit through emission control lines;
a data driver configured to supply a data voltage to the display unit through the data line; and a power supply configured to commonly supply, to the pixels, an initialization voltage, the initialization voltage having a voltage level switching between a first voltage level and a second voltage level in a preset period, wherein:
the power supply is configured to supply the initialization voltage having the first voltage level to overlap one of the first scan pulses supplied to the first scan line such that the initialization voltage having the first voltage level is supplied to a gate electrode of the driving transistor, and
the power supply is configured to supply the initialization voltage having the second voltage level for turning off the driving transistor to overlap another one of the first scan pulses supplied to the first scan line such that the initialization voltage having the second voltage level is supplied to the gate electrode of the driving transistor during a portion of the bias period.

2. The organic light emitting display device of claim 1, wherein a period in which the scan driver supplies the second scan pulse to the first scan line and a period in which the power supply supplies the initialization voltage having the first voltage level overlap with each other in the data write period.

3. The organic light emitting display device of claim 2, wherein a scan signal transferred to the second scan line corresponds to a scan signal transferred to the first scan line shifted by one horizontal period.

4. The organic light emitting display device of claim 1, wherein the power supply is configured to supply the initialization voltage having the first voltage level and the initialization voltage having the second voltage level alternately, corresponding to the respective first scan pulses supplied to the first scan line during the bias period.

5. The organic light emitting display device of claim 4, wherein the first voltage level is a negative voltage, and the second voltage level is a positive voltage.

6. The organic light emitting display device of claim 1, wherein the scan driver is configured to sequentially supply a scan signal to pixel lines, and
wherein the scan driver is configured to skip the supply of the scan signal to the display unit for every preset timing.

7. The organic light emitting display device of claim 6, wherein the scan signal to be supplied to the display unit is additionally shifted by a preset shift period from the scan signal of a previous pixel line at an interval of preset pixel lines.

8. The organic light emitting display device of claim 6, wherein the power supply is configured to switch the voltage level of the initialization voltage every two horizontal periods.

9. The organic light emitting display device of claim 1, wherein the emission driver is configured to sequentially supply the emission control signal to pixel lines, and
wherein the emission driver is configured to skip the supply of the emission control signal to the display unit for every preset timing.

10. The organic light emitting display device of claim 1, wherein, when the scan driver supplies the first scan pulses to the first scan line, the power supply is configured to supply the initialization voltage to the gate electrode of the driving transistor included in a pixel corresponding to the first scan line.

11. The organic light emitting display device of claim 10, wherein the power supply is configured to supply the initialization voltage having the first voltage level and the initialization voltage having the second voltage level alternately, to the gate electrode of the driving transistor in response to the first scan pulses supplied to the first scan line in the bias period.

12. The organic light emitting display device of claim 10, wherein the data voltage of previous pixel lines is supplied to the driving transistor in response to the first scan pulses supplied to the second scan line in the bias period.

13. The organic light emitting display device of claim 10, wherein the data write period includes an initialization period, in which the scan driver is configured to supply the second scan pulse to the first scan line and a write period, in which the scan driver is configured to supply the second scan pulse to the second scan line, and
wherein the power supply is configured to supply the initialization voltage having the first voltage level in the initialization period.

14. The organic light emitting display device of claim 13, wherein a data voltage of a pixel corresponding to a current first scan line is supplied to the driving transistor in response to receiving the second scan pulse supplied to the second scan line in the write period.

15. A method for driving an organic light emitting display device, the method comprising:
supplying an initialization voltage of a current frame to a pixel in response to a plurality of first scan pulses supplied through a first scan line during a bias period of the current frame, the pixel including a driving transistor;
supplying a previous data voltage to the pixel in response to the first scan pulses supplied to a second scan line during the bias period, the previous data voltage being a data voltage of a previous pixel line;
supplying the initialization voltage having a first voltage level to the pixel in response to a second scan pulse supplied through the first scan line in an initialization period of the current frame subsequent to the bias period;
supplying a current data voltage to the pixel in response to the second scan pulse supplied through the second scan line in a data write period of the current frame subsequent to the initialization period, the current data voltage being a data voltage of the pixel; and
emitting light with a grayscale corresponding to the current data voltage in response to an emission control signal supplied to an emission control line,
wherein the initialization voltage has a voltage level switching between the first voltage level and a second voltage level larger than the first voltage level, wherein:
the initialization voltage having the first voltage level is supplied to overlap one of the first scan pulses supplied to the first scan line such that the initialization voltage having the first voltage level is supplied to a gate electrode of the driving transistor, and
the initialization voltage having the second voltage level for turning off the driving transistor is supplied to overlap another one of the first scan pulses supplied to the first scan line such that the initialization voltage having the second voltage level is supplied to the gate electrode of the driving transistor during a portion of the bias period.

16. The method of claim 15, wherein the first voltage level is a negative voltage, and the second voltage level is a positive voltage.

17. The method of claim 15, wherein the first scan pulses and the second scan pulse transferred to the second scan line are the first scan pulses and the second scan pulse transferred to the first scan line respectively shifted by one horizontal period.

\* \* \* \* \*